United States Patent
Arai

(10) Patent No.: US 6,252,286 B1
(45) Date of Patent: Jun. 26, 2001

(54) SEMICONDUCTOR DEVICE HAVING A LIGHT-RECEIVING ELEMENT, OPTICAL PICKUP DEVICE AND METHOD OF MANUFACTURING A SEMICONDUCTOR DEVICE HAVING A LIGHT-RECEIVING ELEMENT

(75) Inventor: Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/264,691

(22) Filed: Mar. 9, 1999

(30) Foreign Application Priority Data

Mar. 17, 1998 (JP) .................................................. 10-067145

(51) Int. Cl.$^7$ .................................................... H01L 31/00
(52) U.S. Cl. .......................... 257/446; 257/184; 257/431; 438/57; 438/73
(58) Field of Search .................................. 257/431, 433, 257/446, 184; 438/57, 73

(56) References Cited

U.S. PATENT DOCUMENTS 5,412,229 * 5/1995 Kuhara et al. ....................... 257/183
5,466,962 * 11/1995 Yamamoto et al. .................. 257/437
5,777,352 * 7/1998 Reele .................................. 257/184

FOREIGN PATENT DOCUMENTS 0 766 323 A2   4/1997 (EP) .
0 778 621 A2   6/1997 (EP) .

* cited by examiner

Primary Examiner—Eddie C. Lee
Assistant Examiner—Allan R. Wilson
(74) Attorney, Agent, or Firm—Sonnenschein, Nath & Rosenthal

(57) ABSTRACT

When a light is irradiated on and near separated portions of a light-receiving element, a frequency characteristic grows worse. According the present invention, a light-receiving element is formed on a semiconductor substrate by a junction portion of a first conductivity-type first semiconductor portion and a second conductivity-type second semiconductor portion, i.e. p-n junction. Then, a second conductivity-type separating region is formed on a part of the first semiconductor portion. With application of a reverse-bias voltage lower than a reverse-bias voltage applied to the junction portion when the light-receiving element is driven, the first semiconductor portion is separated into a plurality of portions by a spread of a depletion layer from the junction portion comprising the light-receiving element and the junction portion comprised of the separating region, whereby the frequency characteristic is improved.

10 Claims, 8 Drawing Sheets

SEMICONDUCTOR DEVICE HAVING A LIGHT-RECEIVING ELEMENT, OPTICAL PICKUP DEVICE AND METHOD OF MANUFACTURING A SEMICONDUCTOR DEVICE HAVING A LIGHT-RECEIVING ELEMENT

RELATED APPLICATION DATA

The present application claims priority to Japanese Application No. P10-067145 filed Mar. 17, 1998 which application is incorporated herein by reference to the extent permitted by law.

BACKGROUND OF THE INVENTION

1. Field of the Invention

The present invention relates to a semiconductor device having a light-receiving element, an optical pickup device and a method of manufacturing a semiconductor device having a light-receiving element.

2. Description of the Related Art

Photodiodes available as a light-receiving element capable of converting a light signal into an electrical signal are widely used as a control light sensor in a variety of photoelectric converters, e.g. a sensor for detecting an information signal (hereinafter referred to as an RF signal), a tracking error signal, a focusing error signal or the like in a so-called optical pickup device for optically recording or reproducing or for effecting both of optical recording and reproduction on an optical recording medium.

This light-receiving element is mounted on the same semiconductor substrate in a mixed state together with other circuit elements, e.g. a variety of circuit elements such as a bipolar transistor, a resistor, a capacitor or the like, thereby being configured as a so-called photo-IC (optical integrated circuit). Such photo-IC is generally manufactured in accordance with a manufacturing method of a bipolar transistor serving as the above-mentioned other circuit elements.

In a photo-IC having a high-speed and high-sensitivity light-receiving element, there is proposed such one having a high-resistance epitaxial semiconductor layer.

FIG. 1 is a schematic cross-sectional view of a conventional this kind of a photo-IC in which a photodiode PD serving as a light-receiving element and a bipolar transistor TR are mounted in a mixed state. In this example, there is configured a bipolar transistor available as a photo-IC in which an npn-type transistor TR and an anode-common type photodiode PD are formed on the same semiconductor substrate 1.

In this bipolar IC, a high impurity concentration p-type buried layer 3 is formed on the whole surface of one major surface of a p-type Si semiconductor base 2, and a low impurity concentration p-type first semiconductor layer 31 comprising an anode region 4 of the photodiode PD is epitaxially grown on this buried layer 3. Then, a high impurity concentration collector buried region 5 is formed on this first semiconductor layer 31 at its portion in which the transistor TR is formed. A high impurity concentration buried separating region 6 is selectively deposited between respective circuit elements and on the separating portion of the photodiode PD, which will be described later on, etc. Also, at the same time this buried separating region 6 is deposited, a p-type high impurity concentration buried region 8 is formed under a contact portion of an anode electrode 7 relative to the photodiode PD.

On the first semiconductor layer 31, there is further epitaxially deposited a low impurity concentration n-type second semiconductor layer 32 forming a cathode region 9 of the photodiode PD and a collector region 10 of the transistor TR.

On the surface of the Si semiconductor substrate 1 in which the first and second semiconductor layers 31 and 32 are epitaxially deposited on the semiconductor base 2, i.e. the second semiconductor layer 32, there is deposited a separating and insulating layer 11 made of $SiO_2$ between electrically-separated semiconductor circuit elements or regions by a local heat oxidation, i.e. so-called LOCOS (Local Oxidation of Silicon).

A p-type high impurity concentration separating region 12 is formed between the separating and insulating layer 11 at the insulating and separating portion formed between the circuit elements below the separating and insulating layer 11 and the buried separating region 6 formed below the separating and insulating layer. A high impurity concentration p-type anode electrode deriving region 13 is deposited on the high impurity concentration buried layer 8, and a high impurity concentration anode contact region 14 is deposited on the anode electrode deriving region. A p-type high impurity concentration separating region 30 is deposited on the buried region 6 formed on the separated portion of the anode region 4 in contact with this region 6.

Then, an n-type high impurity concentration collector electrode deriving region 15 and a p-type base region 16 are deposited on the collector region 10. An n-type emitter region 17 is deposited on the base region 16.

Also, on each anode 4 of the photodiode PD, there is deposited a high impurity concentration cathode region 18 to which a cathode electrode 19 is contacted in an ohmic fashion.

On the surface of the semiconductor substrate 1, there is deposited an insulating layer 21 made of such as SiO2 or the like. This insulating layer has formed therethrough electrode contact-windows to which the emitter, the base and the collector electrodes 20E, 20B and 20C of the transistor TR are contacted, respectively. Then, on the insulating layer, there is deposited an interlayer insulator layer 22 such as $SiO_2$ or the like. This interlayer insulator layer has formed thereon a light-shielding layer 23 made of Al or the like and having a light-receiving window. A protecting film 24 is deposited on this light-shielding layer.

Then, the insulating layers 21 and 22 are used as antireflection films so that a detection light is irradiated on the photodiode PD through the light-receiving window of the light-shielding layer 23.

The photodiode PD in the above-mentioned IC may be arranged as a sensor for detecting an RF signal, a tracking error signal and a focus error signal in an optical pickup device which is able to optically record, reproduce or both record and reproduce an optical recording medium, for example.

FIG. 2A shows a plan pattern view of the photodiode PD available as the sensor for detecting the RF signal, the tracking error signal and the focus error signal in the optical pickup device, for example. In this example, three light spots of a center light spot $SP_0$ and side spots $SP_{S1}$ and $SP_{S2}$ on both sides from an optical recording medium, e.g. optical disk are irradiated on a quadrant photodiode $PD_0$, for example, and photodiodes $PD_{S1}$ and $PD_{S2}$ on both sides, whereby the focus error signal is obtained by a calculation of $(A+C)-(B+D)$ where A to D respectively represent outputs photo-electrically-converted at respective portions A, B, C and D of the quadrant photodiode PD, the tracking error signal is obtained by a calculation of $(E-F)$ where E and F respectively represent the outputs of other two photodiodes $PD_{S1}$ and $PD_{S2}$ and the signal read-out output, i.e. RF signal is obtained by a calculation of (A+B+C+D).

FIG. 2B similarly shows an example of the photodiode PD which is applied to an optical pickup device, for example. In this example, spots $SP_1$ and $SP_2$ are irradiated on the photodiodes $PD_1$ and $PD_2$ which are respectively parallelly divided by four to provide photodiode portions A, B, C, D and A', B', C', D'. In this case, the two photodiode portions B, C and B', C' at the center of the respective photodiodes are formed as extremely-narrow stripe-like patterns of 14 (m pitch, for example. Then, when outputs of the respective portions A, B, C, D and A', B', C', D' of the respective photodiodes $PD_1$ and $PD_2$ are respectively assumed to be A, B, C, D and A', B', C', D', a focus error signal is obtained by a calculation of (B+C)–(A+D)–{(B'+C')–(A'+D')}, then a tracking error signal is obtained by a calculation of (A+B+C'+D')–(C+D+A'+B') and an RF signal is obtained by a calculation of (A+B+C+D)+(A'+B'+C'+D').

In the semiconductor device having the photodiode divided into a plurality of portions like the above-mentioned quadrant photodiode, as shown in FIG. 1, the cathode region 9 is separated along the whole thickness by the separating region 30 and the buried separating region 6 formed below the separating region.

That is, in the arrangement of the conventional semiconductor device, when the photodiode PD is not operated under the condition that the reverse bias voltage is not applied to the photodiode PD, the cathode region 9 is completely separated by the separating region 30 and the buried separating region 6 formed below the separating region. Then, when the photodiode PD is operated, by the reverse bias voltage applied to this photodiode, depletion layers are spread in the anode region 4 and the cathode region 9 from the p-n junction comprised of the anode region 4 and the cathode region 9 and the p-n junction comprised of the separating region 30 and the cathode region 9 as shown by dot-and-dash lines a and a' in FIG. 1.

However, when the semiconductor device including the light-receiving element formed of the above-mentioned arrangements of FIGS. 2A and 2B, i.e. so-called photo-IC is formed so that the light spots are irradiated over the respective portions of A, B, C, D and A', B', C', D', i.e. the respective separating region 30 and the buried separating region 6 formed below the separating region, a frequency characteristic of the photodiode is deteriorated.

The frequency characteristic in the photodiode is mainly determined by a CR time constant dependent on its parasitic capacity (C) and parasitic resistance (R), a time in which carriers travel within the depletion layer in the photodiode and a time in which carriers are diffused in the semiconductor layer which is not depleted.

Accordingly, in the above-mentioned quadrant photodiode, for example, the frequency characteristic changes at the position near the separating region 30 and the buried separating region 6 and at the position sufficiently distant from the above-mentioned position.

This will be described with reference to FIG. 1. In minority carriers, i.e. electrons e generated within the buried separating region 6 and the nearby anode region 4 by a light irradiation, the potential of this buried separating region 6 acts as a barrier against the electrons e of the minority carriers so that these electrons e are forced so as to move away from the depletion layer as shown by arrows b. As a result, these electrons e cannot linearly travel to the depletion layer and hence travel along the curved route. On the other hand, electrons e generated at the position sufficiently distant from the buried separating region 6 are not influenced or hardly influenced by this potential so that these electrons travel toward the depletion layer linearly as shown by arrows c. That is, the electrons generated in and near the buried separating region 6 should travel the long distance toward the depletion layer as compared with the electrons at the position sufficiently distant from the buried separating region 6. Therefore, a diffusion time of carriers is extended so that a frequency characteristic is deteriorated.

Therefore, as mentioned before, when the quadrant photodiode, for example, is used and light spots are irradiated on the regions including the buried separating region 6 and hence the separated regions, since the area of the separated regions occupies a large part of the light irradiated area, there arises a problem in the frequency characteristic. In particular, since the RF signal is detected as a sum signal from the respective separated regions, the deterioration of the frequency characteristic becomes a serious problem. Also, this becomes quite serious in the RF signal whose high speed efficiency is one of the most important requirements.

SUMMARY OF THE INVENTION

According to the present invention, even when a light is irradiated on the photodiode, i.e. the separated or divided portions of the light-receiving element and the nearby portions, the frequency characteristic may be improved.

According to the present invention, in a semiconductor device having a light-receiving element and an optical pickup device using this semiconductor device having the light-receiving element, the traveling distances of minority carriers generated when a light is irradiated on the light-receiving element are made substantially uniform, and the occurrence of the potential barrier for causing the minority carriers to make a detour may be avoided.

Specifically, in a semiconductor device having a light-receiving element according to the present invention, a light-receiving element is formed on a semiconductor substrate by a junction portion comprised of a first conductivity-type first semiconductor portion and a second conductivity-type second semiconductor portion, i.e. p-n junction.

Then, a second conductivity-type separating or dividing region is formed on a part of the first semiconductor portion and the first semiconductor portion is separated into a plurality of portions by a junction portion comprising the light-receiving element with an application of a reverse bias voltage lower than a reverse bias voltage applied to the junction portion when the light-receiving element is operated and by a portion of a depletion layer spread from the junction portion by the separating region.

Also, an optical pickup device according to the present invention is an optical pickup device having a semiconductor light-emitting element, a semiconductor device having a light-receiving element and an optical system. A semiconductor device having a light-receiving element is arranged as the semiconductor device having the light-receiving element according to the present invention described above.

Moreover, according to the present invention, there is provided a method of manufacturing a semiconductor device having a light-receiving element comprising the steps of forming a second conductivity-type high impurity concentration buried layer in one major surface of a semiconductor substrate or on one major surface of a semiconductor substrate, forming a second semiconductor layer comprising a second conductivity-type first semiconductor portion forming a light-receiving element on the high impurity concentration buried region, forming a second semiconductor layer comprising a first conductivity-type first semiconductor portion forming the light-receiving element on the second semiconductor layer, selectively forming a second conductivity-type separating or dividing region, which separates the light-receiving element into a plurality of light-receiving elements, on the first semiconductor layer while leaving a part of a thickness of the first semiconductor layer, and selectively forming a first conductivity-type high impurity concentration third semiconductor portion on or near the surface of the first semiconductor portion, whereby there is obtained a semiconductor device having a light-receiving element according to the present invention.

As described above, in the device according to the present invention, the light-receiving element is separated by the depletion layer generated by the reverse-bias voltage applied when this light-receiving element is operated. According to this arrangement, the existence of the separating regions makes it possible to avoid the occurrence of the potential barrier for detouring the traveling of minority carriers generated when a light is irradiated on the semiconductor portion of the light-receiving element.

DESCRIPTION OF THE PREFERRED EMBODIMENTS

Figure 1:
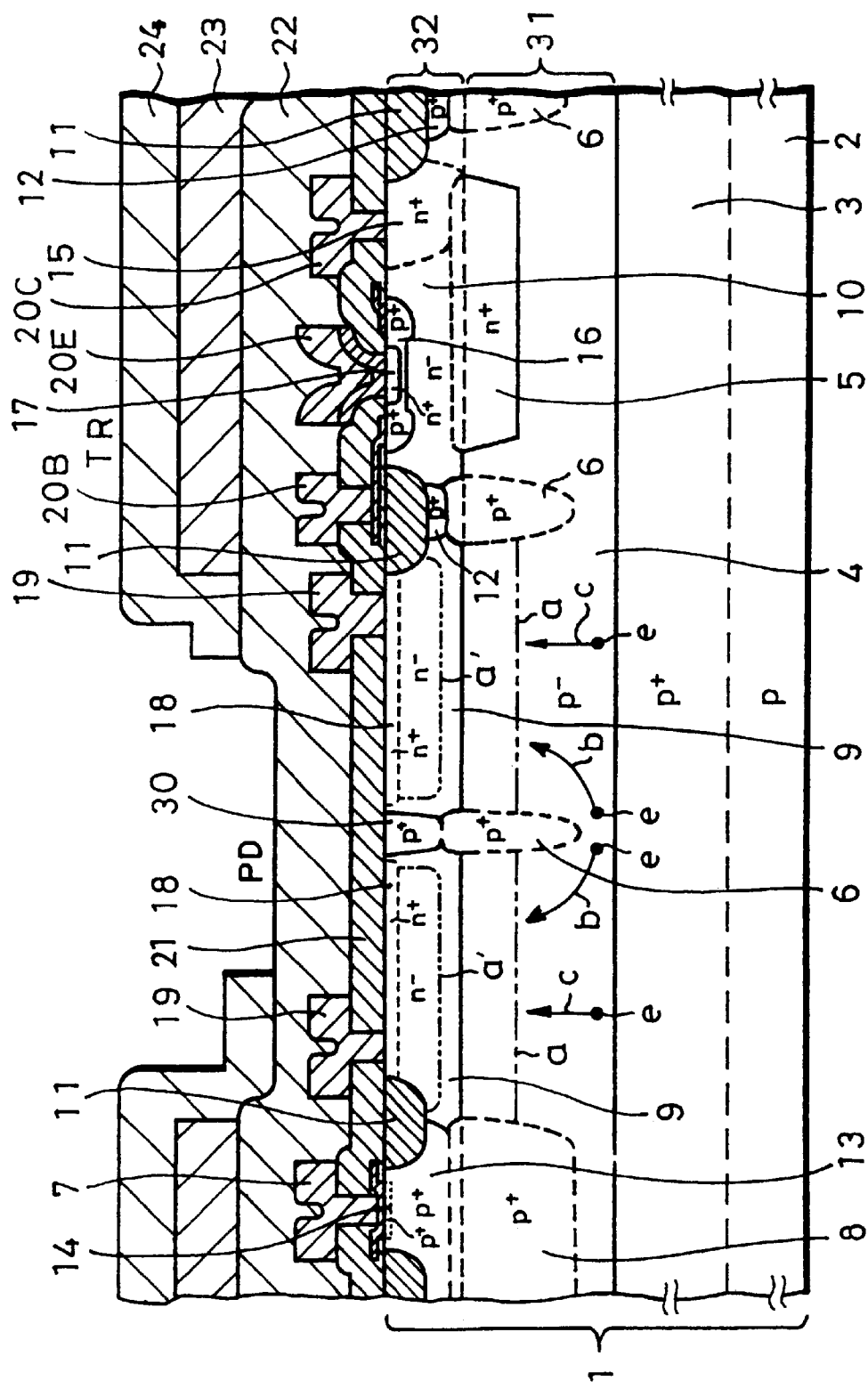
FIG. 1 is a schematic cross-sectional view of a conventional device.

An embodiment according to the present invention will be described.

In a semiconductor device having a light-receiving element according to the present invention, a light-receiving element is formed on a semiconductor substrate by a junction portion comprised of a first conductivity-type first semiconductor portion and a second conductivity-type second semiconductor portion, i.e. p-n junction.

Then, a second conductivity-type separating region is formed on a part of the first semiconductor portion. The first semiconductor portion is separated into a plurality of portions by a junction portion comprising the light-receiving element with an application of a reverse bias voltage lower than a reverse bias voltage applied to the junction portion, specifically, 0.3V to 11.0V, further typically, 0.5V to 1.5V when the light-receiving element is operated and by a portion of a depletion layer spread from the junction portion by the separating region.

The first semiconductor portion is not separated into a plurality of portions by the depletion layer under the condition that only a voltage which is sufficiently lower than a reverse bias voltage obtained when the light-receiving element is operated is applied to the junction portion comprising the light-receiving element.

To this end, the separating or dividing region is formed on the first semiconductor portion at its position distant from the second semiconductor portion with a predetermined interval.

Alternatively, the separating region is formed at a position of the first semiconductor portion displaced toward the side of the second semiconductor portion.

Alternatively, the separating region is formed on the first semiconductor portion at its limited intermediate portion in a thickness direction thereof.

A high impurity concentration third semiconductor portion having the same conducting type as that of the first semiconductor portion is formed on the first semiconductor substrate at its surfaces of portions separated by the depletion layer.

A thickness of this third semiconductor portion may be selected in a range of from 0.01 $\mu$m to 0.2 $\mu$m.

A fourth semiconductor portion having a high impurity concentration as compared with that of the second semiconductor portion is formed on the second semiconductor substrate at its side opposite to the junction portion comprising the light-receiving element in such a manner as to become adjacent to the second semiconductor portion.

In this case, a length from the surface of the semiconductor substrate to the fourth semiconductor portion is selected to be larger than an absorption length of an incident light on the light-receiving element.

Also, an optical pickup device according to the present invention is an optical pickup device having a semiconductor light-emitting element, a semiconductor device having a light-receiving element and an optical system. The semiconductor device having a light-receiving element is arranged as the semiconductor device having the light-receiving element according to the present invention.

Moreover, according to the present invention, there is provided a method of manufacturing a semiconductor device having a light-receiving element comprising the steps of forming a second conductivity-type high impurity concentration buried layer in one major surface of a semiconductor substrate or on one major surface of a semiconductor substrate, forming a second semiconductor layer comprising a second conductivity-type first semiconductor portion forming a light-receiving element on the high impurity concentration buried region, forming a second semiconductor layer comprising a first conductivity-type first semiconductor portion forming the light-receiving element on the second semiconductor layer, selectively forming a second conductivity-type separating or dividing region, which separates the light-receiving element into a plurality of light-receiving elements, on the first semiconductor layer while leaving a part of a thickness of the first semiconductor layer, and selectively forming a first conductivity-type high impurity concentration third semiconductor portion on or near the surface of the first semiconductor portion, whereby there is obtained a semiconductor device having a light-receiving element according to the present invention.

A semiconductor device having a light-receiving portion according to an embodiment of the present invention will be described with reference to FIG. 3. However, the device according to the present invention is not limited to this arrangement.

Figures 2A, 2B:
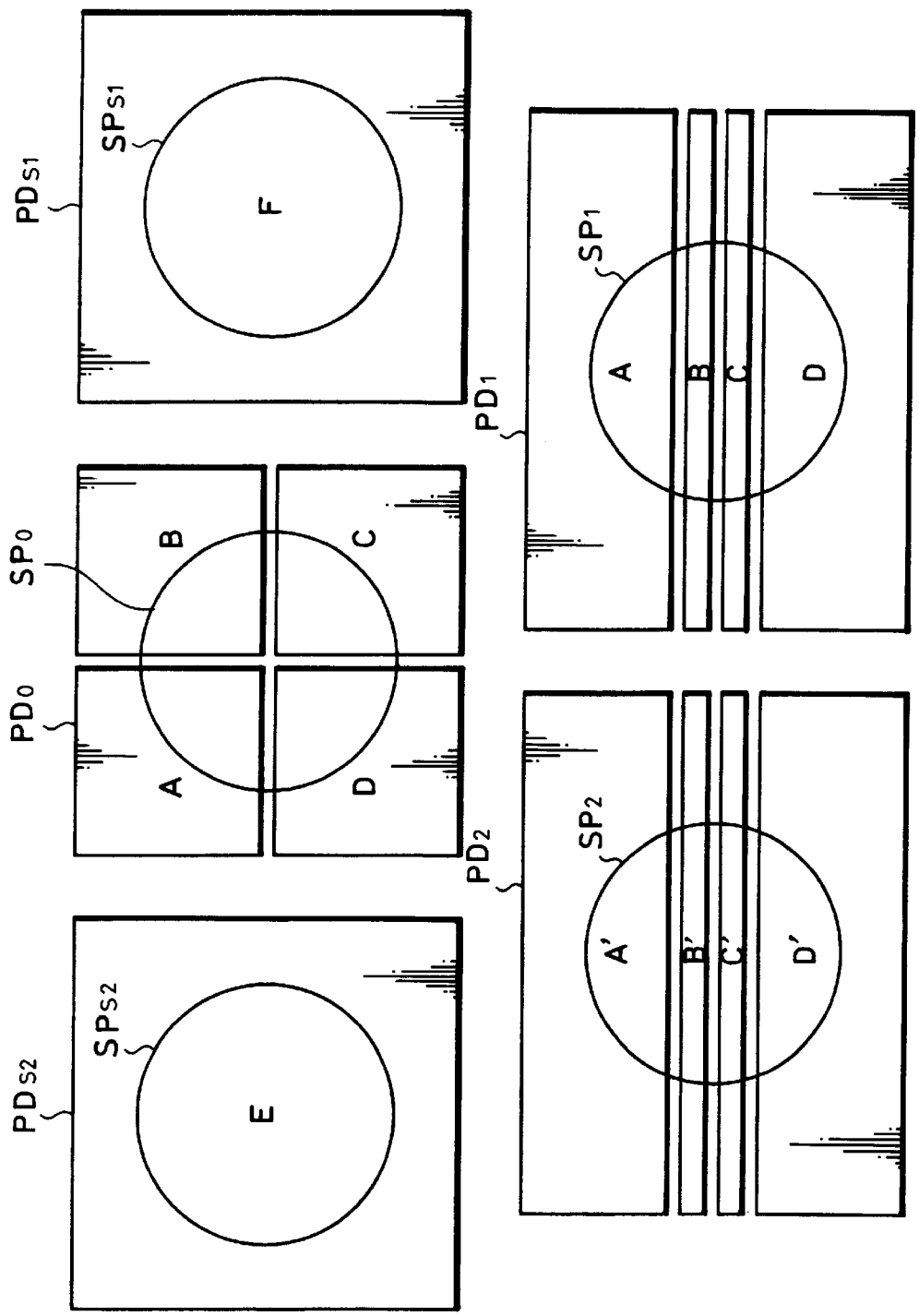
FIGS. 2A and 2B are pattern diagrams of examples of photodiodes, respectively.
Figure 3:
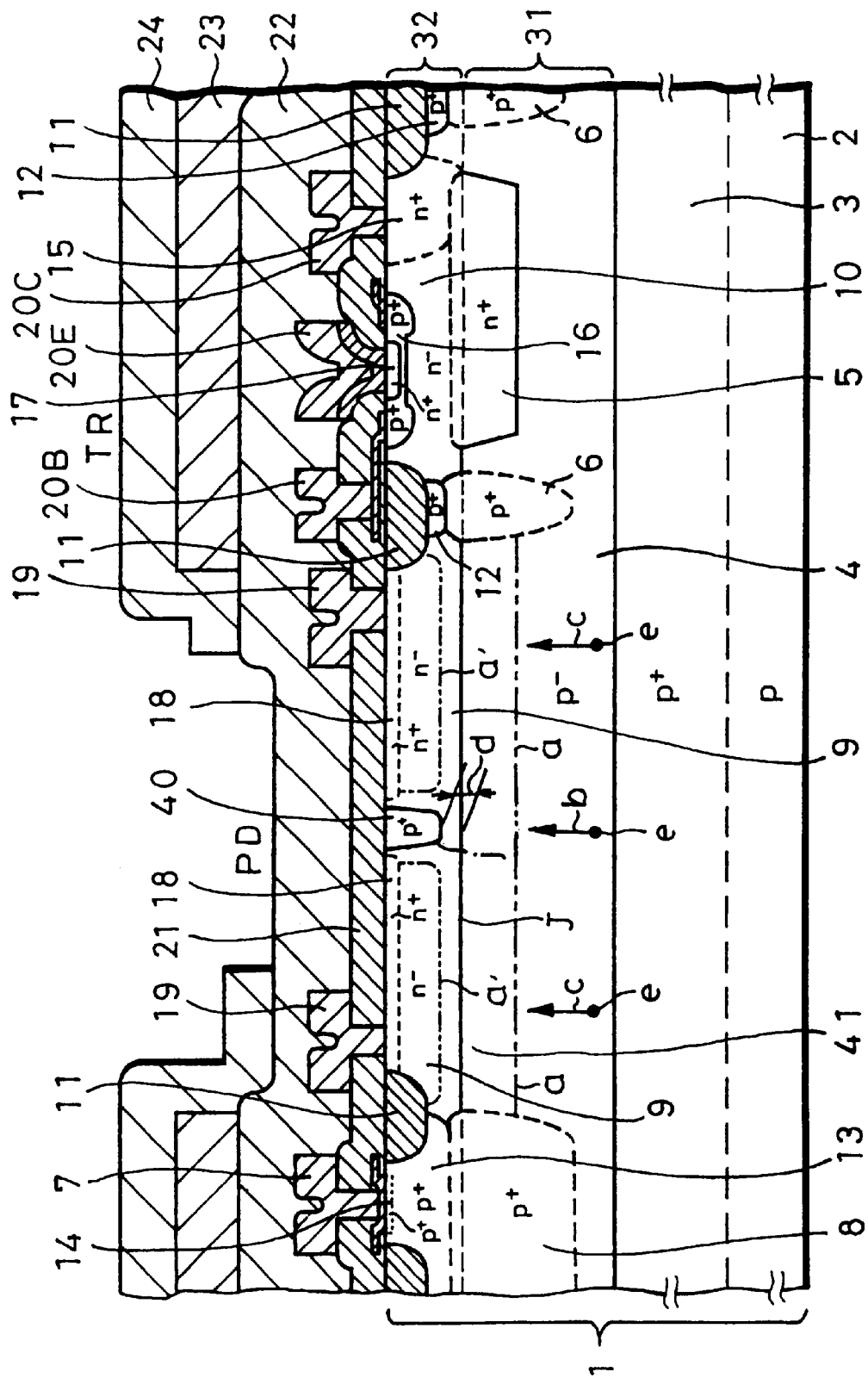
FIG. 3 is a schematic cross-sectional view of a device according to an embodiment of the present invention.

FIG. 3 is a schematic cross-sectional view illustrating the case in which the present invention is applied to the photo-IC in which the photodiode PD serving as the light-receiving element and the bipolar transistor TR are mounted in a mixed state similarly to FIG. 1. Moreover, in this example, there is arranged a bipolar IC serving as the photo-IC in which an npn-type transistor TR and an anode-common-type photodiode PD are formed on the same semiconductor substrate 1. Then, in this case, the photodiode PD is divided into a plurality of portions as shown in FIGS. 2A or 2B. FIG. 3 shows the state in which the photodiode is divided into two portions.

In this bipolar IC, on a p-type Si semiconductor base, i.e. one major surface of a substrate 2, there is wholly deposited a high impurity concentration p-type buried layer 3 corresponding to the aforementioned fourth semiconductor portion. On this buried layer 3, there is epitaxially deposited a low impurity concentration p-type first semiconductor layer 31 comprising an anode region 4 of the photodiode PD corresponding to the aforementioned second semiconductor portion. Then, a high impurity concentration collector buried region 5 is formed on this first semiconductor layer 31 at its portion in which the transistor TR is formed. A high impurity concentration buried separating region 6 is formed between respective circuit elements.

However, in this case, unlike the conventional structure shown in FIG. 1, the buried region 6 is not formed in the divided portions of the photodiode PD.

A p-type high impurity concentration buried region 8 is formed beneath the portion in which an anode electrode 7 for the photodiode PD is formed.

On the first semiconductor layer 31, there is epitaxially deposited a low impurity concentration n-type second semiconductor layer, 32 forming a cathode region 9 of the photodiode PD corresponding to the aforementioned first semiconductor portion and a collector region 10 of the transistor TR.

In this manner, there is formed the Si semiconductor substrate 1 in which the first and second semiconductor layers 31 and 32 are epitaxially deposited on the semiconductor substrate 2. On its surface, i.e. on the second semiconductor layer 32, there is deposited an $SiO_2$ separating and insulating layer 11 by the LOCOS between semiconductor circuit elements or the regions which are electrically isolated from each other.

A p-type high impurity concentration separating region 12 is formed between the separating and insulating layer 11 in the insulating and separating portion between the circuit elements beneath the separating and insulating layer 11 of the second semiconductor layer 32 and the buried separating region 6 below the insulating and separating layer. On the high impurity concentration buried region 8 below the portion in which the anode electrode 7 is disposed, there is formed a p-type impurity concentration anode electrode deriving region 13 on which a high impurity concentration anode contact region 14 is deposited.

Then, in the device according to the present invention, a p-type separating or dividing region 40 having a high impurity concentration as compared with that of the anode region 4 (second semiconductor portion) is deposited on the photodiode PD at its divided position.

The plan pattern of this separating region 40 is a cross pattern if the photodiode $PD_0$ of FIG. 2A is arranged when the separating region is divided into four portions as shown in FIGS. 2A and 2B or is a three parallel stripe pattern if the photodiode $PD_1$ or $PD_2$ shown in FIG. 2B is arranged.

Then, these separated regions 40 are formed at the position distant from the anode region 4, i.e. second semiconductor portion by a predetermined distance d as shown in FIG. 3, for example.

Figure 4:
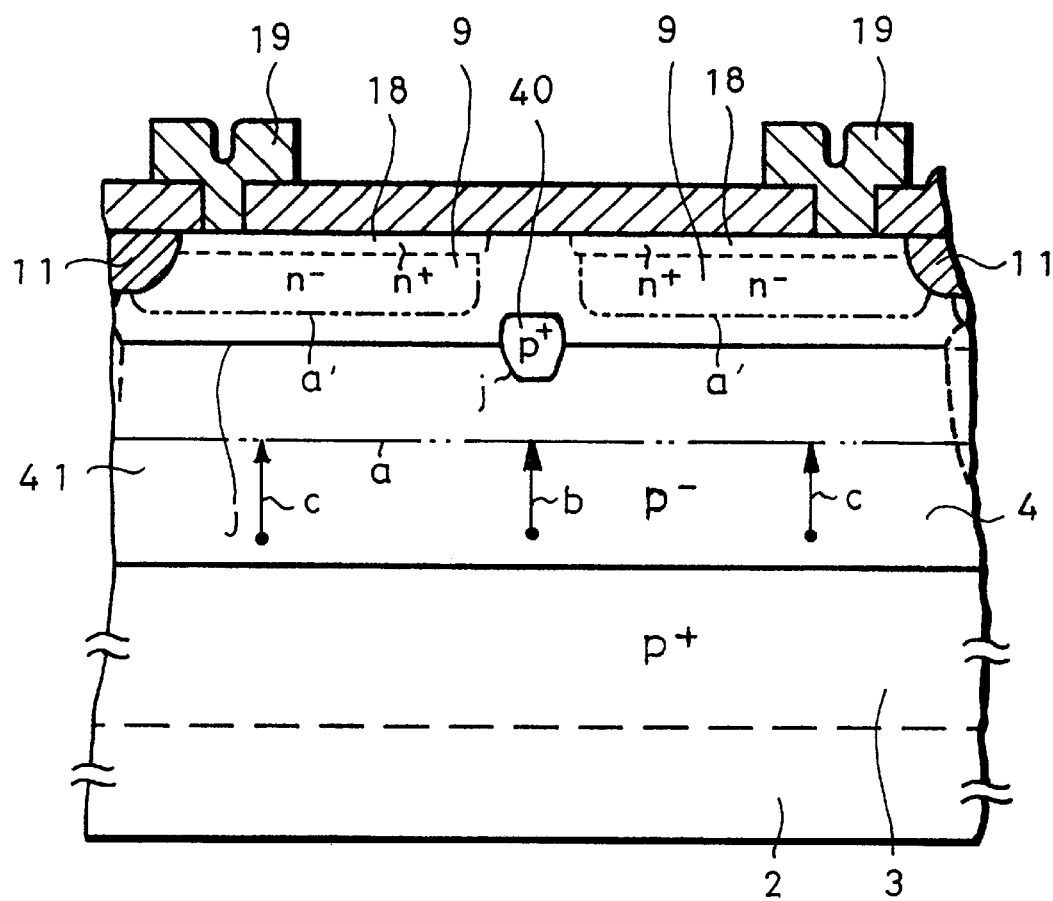
FIG. 4 is a schematic cross-sectional view of a main portion of a device according to other embodiment of the present invention.

Alternatively, as shown in FIG. 4 which is a cross-sectional view of a main portion of the device according to the present invention, the separating region 40 is displaced to the anode region (second semiconductor portion).

Figure 5:
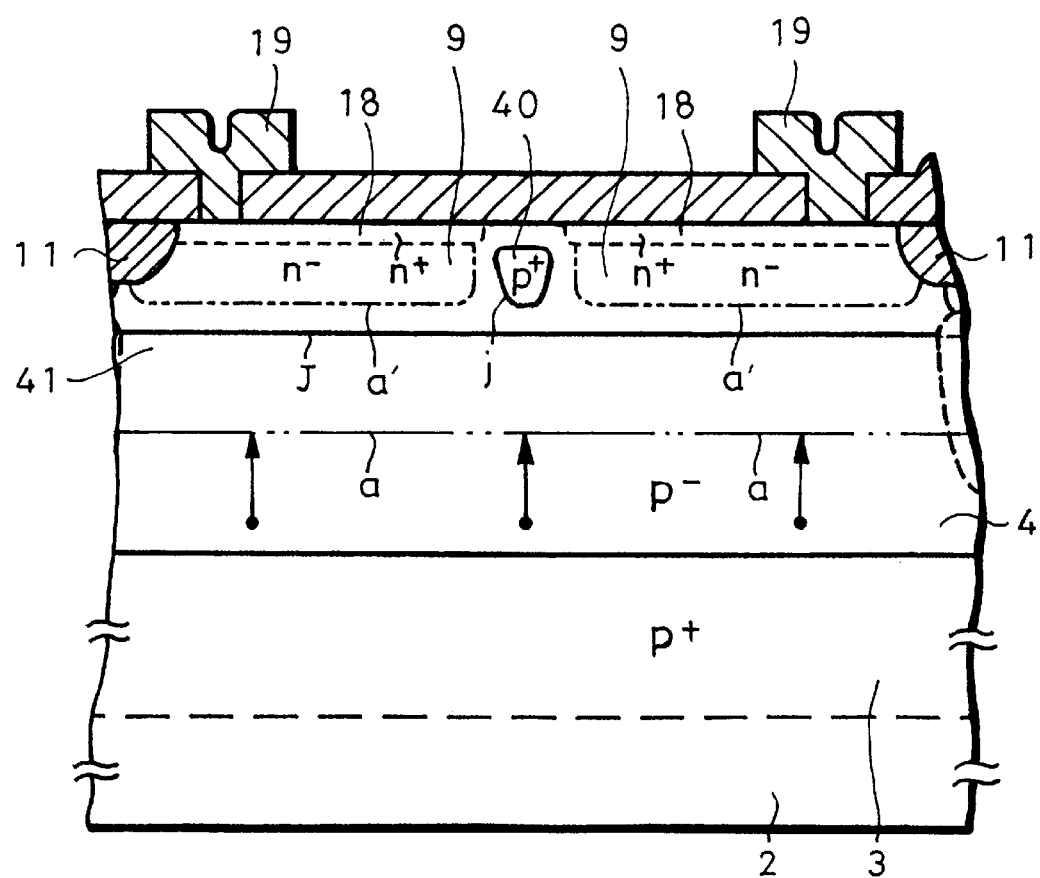
FIG. 5 is a schematic cross-sectional view of a main portion of a device according to other embodiment of the present invention.

Alternatively, as shown in FIG. 5 which is a cross-sectional view of a main portion of the device according to the present invention, the separating region 40 is formed in the cathode region 9, i.e. in the first semiconductor portion at its intermediate portion of the thickness direction, i.e. at the portion in which the separating region does not reach the surface of the first semiconductor portion and also does not reach the anode region 4 (second semiconductor portion). In FIGS. 4 and 5, elements and parts identical to those of FIG. 3 are marked with the same reference numerals and its overlapping explanation will be omitted.

Then, on the collector region 10, as shown in FIG. 3, there are deposited an n-type high impurity concentration collector electrode deriving region 15 and a p-type base region 16. An n-type emitter region 17 is deposited on the base region 16.

Also, on each anode region 4 segmented by the separating region 40 of the photodiode PD, there is deposited a high concentration cathode region 18 having a high impurity concentration as compared with the cathode region 9 and which is equivalent to the aforementioned third semiconductor portion. A cathode electrode 19 is contacted to this cathode region in an ohmic-fashion.

On the surface of the semiconductor substrate 1, there is deposited an insulating layer 21 such as SiO2 or the like. This insulating layer has formed therethrough electrode contact-windows to which the emitter, the base and the collector electrodes 20E, 20B and 20C of the transistor TR are contacted, respectively. Then, on the insulating layer, there is deposited an interlayer insulator layer 22 such as $SiO_2$ or the like. This interlayer insulator layer has formed thereon a light-shielding layer 23 made of Al or the like having a light-receiving window. A protecting film 24 is deposited on this light-shielding layer.

Then, the insulating layers 21 and 22 are used as antireflection films so that a detection light is irradiated on the photodiode PD through the light-receiving window of the light-shielding layer 23.

In the above-mentioned arrangement, when the photodiode PD is operated, a predetermined reverse bias voltage is applied across the anode electrode 7 and the cathode electrode 19. In the device according to the present invention, under the condition that this reverse bias voltage is applied, in the voltage lower than this reverse bias voltage, the cathode region 9, i.e. the first semiconductor portion is separated into a plurality of portions, i.e. separated with respect to the respective divided photodiodes by a depletion layer 41, shown by dot-and-dash lines a' and a, spread from a p-n junction j between the separated region 40 and the cathode region 9 and a p-n junction J between the cathode region 9 and the anode region 4. However, under the condition that the above-mentioned reverse bias voltage is not applied, i.e. under the condition that the photodiode PD is not operated, the position and depth of the separated region 40 and the thicknesses and impurity concentrations of the first and second semiconductor portions, i.e. cathode region 9 and the anode region 4 are selected in such a manner that the respective divided portions of the photodiode PD may not be separated by the separating region 40.

The thickness o the cathode region (first semiconductor portion) 9 is selected in a range of from 0.01 to 10 μm, for example, and its impurity concentration is selected in a range of from $1\times10^{11}$ to $1\times10^{16}$ atoms/cm$^3$.

The thickness of the anode region (second semiconductor portion) 4 is selected in a range of from 0.01 to 600 μm, for example, and its impurity concentration is selected in a range of from $1\times10^{11}$ to $1\times10^{16}$ atoms/cm$^3$.

The thickness of the high concentration cathode region (third semiconductor portion) 18 is selected in a range of from 0.01 to 0.2 μm, for example, and its impurity concentration is selected in a range of from $1\times10^{15}$ to $1\times10^{21}$ atoms/cm$^3$.

The thickness of the buried layer (fourth semiconductor portion) 3 is selected in a range of from 1 to 30 μm, and its impurity concentration is selected in a range of from $1\times10^{16}$ to $1\times 10^{21}$ atoms/cm$^3$.

The thickness of the buried separating layer 6 is selected in a range of from 0.01 to 10 μm, and its impurity concentration is selected in a range of from $1\times10^{14}$ to $1\times10^{21}$ atoms/cm$^3$.

In the above-mentioned arrangement, in order that the depletion layer 41 may completely deplete the anode region 4 (second semiconductor portion), i.e. may deplete the anode region up to the portion of the buried layer 3 (fourth semiconductor portion), the impurity concentration of the second semiconductor portion should preferably be selected to be less than $2\times10^{14}$ atoms/cm$^3$. More preferably, in order that the depletion layer may completely deplete the cathode region 9 (first semiconductor portion), the impurity concentration of the first semiconductor portion should be selected to be less than $5\times10^{14}$ atoms/cm$^3$.

Figure 6:
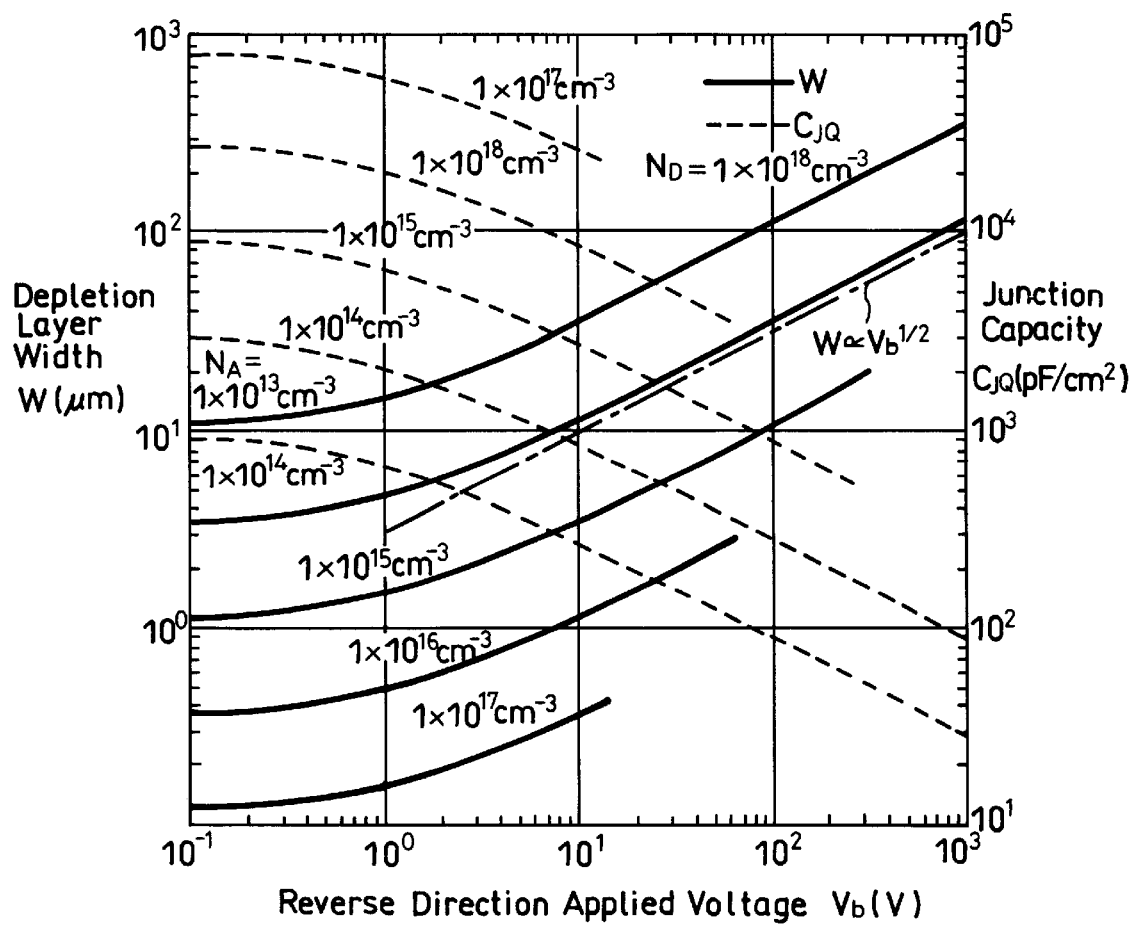
FIG. 6 is a graph showing an impurity concentration dependency of a relation between a reverse bias voltage and spreading of a depletion layer in a p-n junction.

In this connection, an impurity concentration dependence of a relationship between the reverse bias applied voltage and the spreading of the depletion layer in the p-n-junction is well known as shown in FIG. 6 of "OPTICAL COMMUNICATION ELEMENT OPTICS", P329, written by Yonezu, published by KOGAKU TOSYO KABUSHIKI KAISHA, for example, etc.

Also, the distance from the surface of the semiconductor substrate to the fourth semiconductor portion is selected to be longer than an absorption length of an incident light on the light-receiving element so that a photo-electric conversion may be carried out effectively.

According to the above-mentioned device of the present invention, upon operation, the photodiode PD is divided by the depletion layer 41 into a plurality of portions. Light is irradiated on the divided portions, i.e. the portions in which the separating region 40 is formed or the nearby portion in FIGS. 3 to 5. Even when the minority carriers, i.e. electrons e in this example, are generated in the anode region 4 in this divided portion, for example, since the potential barrier is not formed by the buried region 6 in this divided portion shown in FIG. 1, as shown by a route in an arrow b, the electrons may be linearly directed toward the depletion layer 41 similarly to electrons e which are generated in other portions as shown by arrows c. Accordingly, a difference between the traveling distances of minority carriers generated inside may be avoided, thereby making it possible to improve a frequency characteristic.

While the transistor is formed on the common semiconductor substrate 1 together with the light-receiving element, i.e. photodiode as other circuit element as described above, the present invention is not limited thereto, and may be formed as an IC in which an npn-type transistor, a resistor element, a capacity and the like comprised of a semiconductor region are formed as other circuit elements together with a light-receiving element.

While only one photodiode PD which is divided into a plurality of portions is illustrated as the light-receiving element in FIG. 3, as shown in FIGS. 2A and 2B, the present invention may be applied to the photo-IC or the like in which a photodiode that is not divided or a plurality of photodiodes comprised of divided photodiodes are formed on the common semiconductor substrate 1 together with one divided photodiode.

Figure 7:
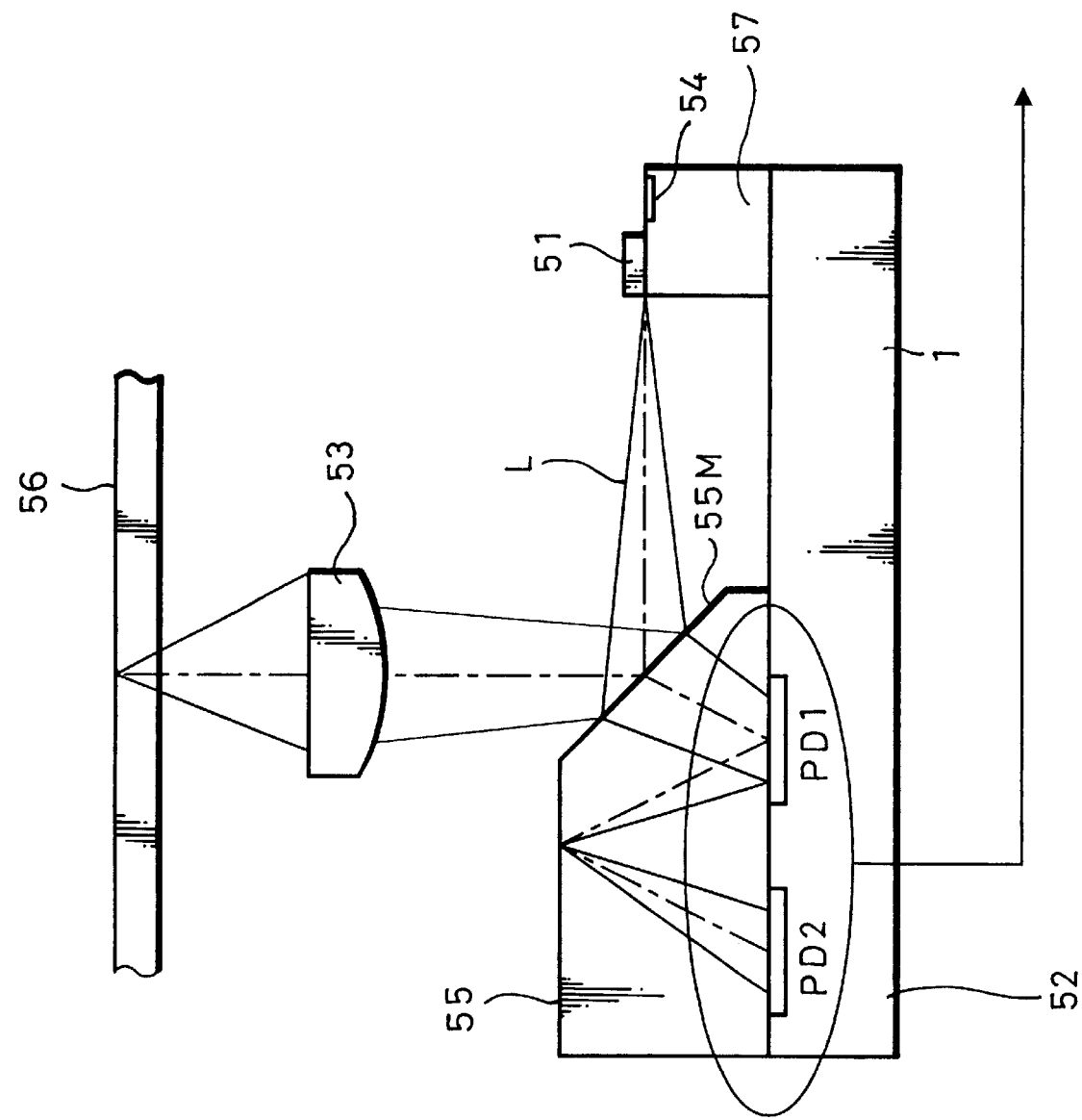
FIG. 7 is a diagram showing a pickup device according to an embodiment of the present invention.

FIG. 7 shows a schematic diagram of an optical pickup device of the present invention that is configured by using the semiconductor device having the light-receiving element according to the present invention.

This optical pickup device includes a so-called laser coupler formed by integrating a semiconductor light-emitting element, e.g. semiconductor laser 51 and a semiconductor device 52 having a light-receiving element according to the present invention and an optical system 53, i.e. objective lens.

The semiconductor device 52 is comprised of the semiconductor device of the present invention in which two photodiodes $PD_1$ and $PD_2$ are formed as shown in FIG. 2B, for example. Specifically, in this case, there is prepared the semiconductor device 52 in which the photodiodes PD1 and PD2, formed similarly to the photodiode PD in FIG. 3, are formed on the semiconductor substrate 1 together with other circuit elements. On the semiconductor substrate 1, there is mounted a block 57 in which a semiconductor laser 51, for example, and a monitor photodetection element 54 for monitoring the output of the semiconductor laser for detecting backward emitted light, e.g., ordinary photodiode are assembled or mounted.

On the other hand, a micro-prism 55 is mounted on the semiconductor substrate 1 of the semiconductor device 52 at its portion in which the respective photodiodes $PD_1$ and $PD_2$ are disposed.

Then, a forward laser light L emitted from the semiconductor laser 51 is reflected on an inclined face 55M formed on the micro-prism 55 and irradiated on an optical recording medium 56, e.g. optical disk through the optical system 53. Its returned light is returned into the micro-prism 55, bent by the inclined face 55M and introduced into the prism 55 so that it becomes incident on one photodiode $PD_1$ of the semiconductor device 52. Its reflected light is introduced into the other photodiode $PD_2$. The optical recording medium 56 has formed thereon, for example, a recording information pit, a groove for obtaining a tracking signal and the like. Accordingly, by calculating the aforementioned respective outputs A to D, A' to D' that are detected by introducing the returned light therefrom into the photodiodes $PD_1$ and $PD_2$, it is possible to obtain the tracking error signal, the focus error signal and the RF signal. Then, although not shown, by the tracking error signal, the optical recording medium and the position of laser light irradiated on this optical recording medium is controlled according to a well-known method. Also, the position of the optical system 53 is adjusted by the focus error signal, thereby resulting in the focusing being controlled.

On the other hand, the backward emitted light from the semiconductor laser 51 is introduced into the monitor photodetection element 54. An output of forward laser beam L is detected in accordance with an output from the monitor photodetection element, whereby a drive voltage applied to the laser 51 is controlled so that the output of the laser is set to a predetermined output.

Since its light-receiving element, i.e. photodiode has the excellent frequency characteristic as mentioned before, the pickup device of this arrangement is able to accurately carry out the tracking and the focusing, and may output an RF signal having a high S/N.

An example of a method of manufacturing the semiconductor device having the light-receiving element shown in FIG. 3 according to the present invention will be described with reference to FIG. 8.

Figures 8A, 8B:
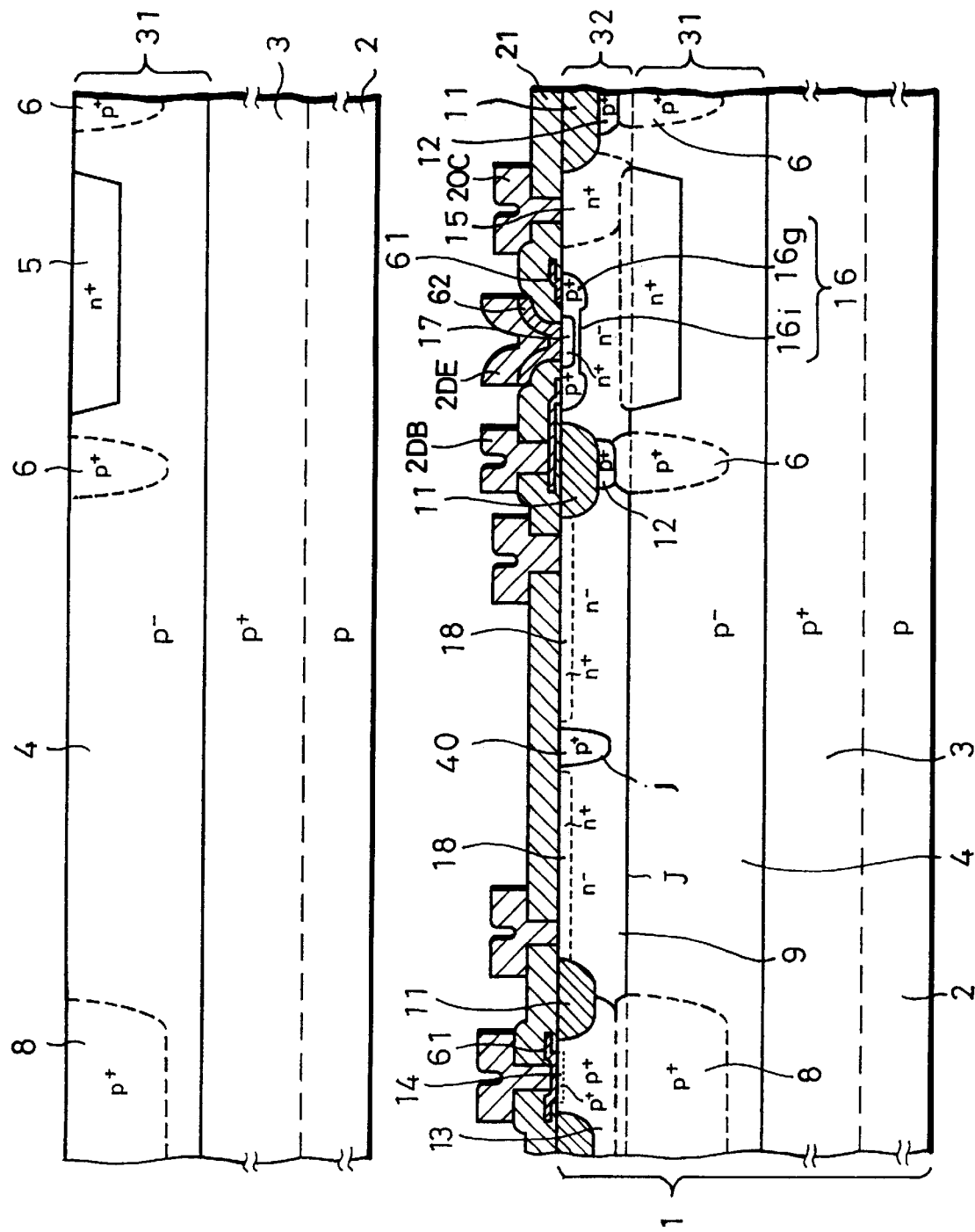
FIGS. 8A and 8B are process diagrams of a manufacturing method according to an embodiment of the present invention.

Initially, as shown in FIG. 8A, there is prepared a first conductivity-type, e.g. p-type Si semiconductor base 2. Then, an oxide film having a thickness of about 120 nm, for example, is deposited on its surface by thermal oxidation, though not shown. Then, a boron ion (B+) is implanted on the whole surface of one major surface of the semiconductor baser 2 through the oxide film at 30 keV with a doze amount of $2.5 \times 10^{15}/cm^2$.

Subsequently, in order to activate the boron ion thus implanted, the product is annealed for 80 minutes in the atmosphere of $N_2$ at 1200° C.

Further, in order to remove a defect caused by a damage brought about when the ion is implanted, the product is heat-treated at 1200° C. for 20 minutes in the atmosphere of so-called wet (WET) $0_2$. In this manner, there is formed a p-type buried layer 3. Thereafter, the oxide film is removed by using hydrofluoric acid.

Then, on the semiconductor base 2 at its major surface in which the buried layer 3 is formed, a p-type first semiconductor layer 31 having the same conductivity-type as that of the buried layer 3 is epitaxially deposited with a thickness of 20 μm, for example, at a resistivity of 50 Ω·cm.

Then, although not shown, after an oxide film having a thickness of 120 nm, for example, was formed by thermally oxidizing the surface of this first semiconductor layer 31, a photo-resist having a predetermined pattern is formed on this oxide film by coating the photo-resist, pattern exposure and development. Then, this product photo-resist is used as a mask, and an opening is formed by etching away the oxide film formed on the surface of the semiconductor layer 31. Thereafter, the photo-resist is removed. To remove the photo-resist, it is possible to use a mixed solution of a hydrogen peroxide solution and sulfuric acid. Then, the boron ion B+ is implanted on the peripheral portion in which the photodiode is formed and the separating portion of other circuit elements at an implanting energy of 30 keV under the condition of $2.5 \times 10^{15}/cm^2$.

Subsequently, in order to activate the boron ion thus implanted, the product is annealed at 1200° C. for 80 minutes in the atmosphere of $N_2$.

Further, in order to remove a defect caused by a damage produced when the ion is implanted, the product is oxidized at 1200° C. for 20 minutes in the atmosphere of wet $0_2$. In this manner, there are formed the p-type buried separating region 6 and the electrode-deriving high-concentration buried region 8 for the anode region of the photodiode.

Further, there is formed a photo-resist of a predetermined pattern having an opening bored through the position equivalent to the transistor forming portion of the first semiconductor layer 31. This photo-resist is used as a mask, and an opening is formed though the oxide film by etching away the oxide film formed on the surface of the semiconductor layer 31. Thereafter, the photo-resist is removed. To remove the photo-resist, it is possible to use a mixed solution of a hydrogen peroxide solution and sulfuric acid.

Then, through the opening formed through the oxide film deposited on the semiconductor layer 31, a second conductivity-type, in this example, n-type collector buried region 5 is formed by heat diffusion at 1200(C. for 60 minutes by using a solid source of $Sb_2O_3$.

Thereafter, the oxide film is removed by heat treatment using hydrogen fluoride.

Thereafter, as shown in FIG. 8B, a second conductivity-type, i.e. n-type second semiconductor layer 32 is epitaxially deposited with a thickness of 3 μm at a resistivity of 1 Ω·cm, for example, thereby resulting in the semiconductor substrate 1 being formed. At that time, due to the heat generated when the second semiconductor layer 32 is epitaxially deposited, impurities are respectively diffused from the respective high concentration collector buried region 5, the buried separating region 6 and the high concentration buried region 8 formed on the first semiconductor layer 31 into the second semiconductor layer 32, thereby resulting in the respective regions 5, 6 and 8 being protruded into the second semiconductor layer 32, respectively.

Then, the separating and insulating layer 11 is formed by the LOCOS. This separating and insulating layer 11 is formed as follows. At first, an $SiO_2$ oxide film having a thickness of 20 nm, for example, is deposited by thermally oxidizing the surface of the second semiconductor layer 32. On this oxide film, there is piled a silicon nitride film $SiO_xN_y$, film having a thickness of 65 nm by a low pressure CVD method. Then, the oxide film, the nitride film and the second semiconductor layer 32 are selectively etched away by a RIE (reactive ion etching) method in such a manner that they may be protruded into the second semiconductor layer 32 by a depth of about 400 nm. Thereafter, the remaining nitride film is used as an oxidation resisting mask, and the separating and insulating layer 11 having a thickness of 800 nm, for example, is formed by thermally oxidizing the second semiconductor layer 32 at 1050° C. in the atmosphere of wet $O_2$.

Thereafter, the nitride film is selectively etched away by etching at 150° C. by phosphoric acid, for example, whereby a first conductivity-type, i.e. n-type high impurity concentration collector electrode deriving region 15 is formed on a part of the collector buried region 5 in the second semiconductor layer 32. When this region 15 is formed, a phosphorous ion (P+) is implanted with an energy of 70 keV at $1 \times 10^{16}/cm^2$.

Then, a heat treatment for activating impurities is executed at 1050° C. for 60 minutes in the atmosphere of $N_2$.

Also, there are formed a p-type high impurity concentration separating region 12, an anode electrode deriving region 13, a dividing or separating region 40 and an n-type high concentration anode region 18, respectively.

The separating region 12, the anode electrode deriving region 13 and the dividing region 40 are formed by selectively implanting the boron ion (B+) with an energy of 400 keV at $1 \times 10^{14}/cm^2$. The high concentration cathode region 18 is formed by implanting arsenic ion (As+) with an energy of 70 keV at $1 \times 10^{15}/cm^2$. Then, the heat treatment for activating respective impurity ions is executed at 1000° C. for 30 minutes, thereby resulting in the p-type high impurity concentration separating region 12, the anode electrode deriving region 13, the dividing region 40 and the n-type high concentration cathode region 18 being formed.

In this case, although the p-type high impurity concentration separating region 12, the anode electrode deriving region 13 and the dividing region 40 are formed simultaneously, the buried separating region 6 and the high concentration buried region 8 are protruded into the second semiconductor layer 32 below the portion in which the separating region 12 and the anode electrode deriving region 13 are formed as mentioned before. Therefore, the separating region 12 and the anode electrode deriving region 13 are formed may be formed so as to contact therewith, and the dividing region 40 may be formed with a depth such that it cannot reach the anode region 4 composed of the first semiconductor layer 31. That is, the dividing region 40 may be formed at the position spaced apart from the anode region 4 (second semiconductor portion) by a predetermined distance.

Thereafter, the semiconductor device is manufactured in accordance with an ordinary bipolar transistor IC manufacturing process. Specifically, there is formed a lower insulating layer such as an oxide film or the like formed on the surface of the second semiconductor layer 32 of the semiconductor substrate 1. Then, an opening is formed through the base region forming portion of the transistor by etching based on a photolithography. At the same time this opening is formed, an opening is also formed on the anode electrode deriving region 13, for example. Then, a first polycrystalline semiconductor layer 61 is formed so as to close these openings. This first polycrystalline silicon layer 61 is a polycrystalline silicon containing a p-type impurity of high concentration.

This first polycrystalline semiconductor layer 61 is etched away by etching based on the photolithography so as to leave the transistor base region forming portion, the electrode deriving portion therefrom, the anode electrode deriving region 13 and the electrode deriving portion therefrom.

Also, an opening is formed on the base region forming portion of the first polycrystalline semiconductor layer 61 at its portion in which an intrinsic base region is formed to form an intrinsic base region 16i by diffusing a p-type impurity. Further, an $SiO_2$ layer or the like is formed, and a surface insulating layer 21 having a predetermined thickness is formed together with the previously-formed lower insulating layer. Then, an opening is formed through the insulating layer 21 on the intrinsic base region 16i, and a second polycrystalline semiconductor layer 62 is formed so as to close this opening. This second polycrystalline semiconductor layer 62 is a polycrystalline silicon layer having an n-type impurity of high concentration.

Then, this second polycrystalline semiconductor layer 62 is etched away by etching based on photolithography so as to leave the emitter electrode deriving portion.

Then, a p-type high concentration graft base region 16g is formed around the intrinsic base region 16i by diffusing impurities from the first and second polycrystalline semiconductor layers 61 and 62 into the semiconductor layer 32. At the same time, a high concentration anode contact region 14 is formed on the anode electrode deriving region 13 and a high concentration n-type emitter region 17 is formed on the intrinsic base region 16i.

The insulating layer 21 has formed therethrough electrode contact-windows to which the emitter, the base and the collector electrodes 20E, 20B and 20C of the transistor TR are contacted, respectively. Then, as shown in FIG. 3, on the insulating layer, there is deposited an interlayer insulator 22 such as $SiO_2$ or the like. This interlayer insulator has formed thereon a light-shielding layer 23 made of Al or the like having a light-receiving window. A protecting film 24 is deposited on this light-shielding layer.

Then, the insulating layers 21 and 22 are used as antireflection films so that a detection light is irradiated on the photodiode PD through the light-receiving window of the light-shielding layer 23.

In this manner, there is formed the semiconductor device in which the transistor TR and the anode-common-type photodiode PD are formed on the common (same) semiconductor substrate 1.

As described above, in the device according to the present invention, the photodiode is divided into a plurality of portions by the depletion layer from the junction j composed of the dividing region 40 of its photodiode PD and the p-n junction J comprising the photodiode. Specifically, the buried region 6 is not formed in this separating portion unlike the conventional structure shown in FIG. 1. Thus, carriers generated by the photo-electric conversion with the light irradiated on this separating or near the separating region may be avoided from being affected by the potential barrier so as to come way therefrom. Therefore, the carriers may travel the shortest distance from its generating position to the depletion layer, and hence the running time of the carrier may be made substantially equal regardless of the light irradiated position. Therefore, even when light is irradiated on the dividing region of the photodiode PD, it is possible to obtain the RF signal having satisfactory frequency characteristics.

While the bipolar transistor TR is of the so-called double polysilicon structure using the first and second polycrystalline silicon layers 61 and 62 as described above, the present invention is not limited thereto, and modifications may be possible such as when the bipolar transistor is of a so-called single polysilicon emitter structure based on an ion implantation method or the like or in which the emitter region is formed by ion implantation.

Moreover, the dividing region 40 is not always formed at the same time the separating region 12 is formed, and respective regions may be formed by different processes.

Also, the second semiconductor portion (i.e. anode region 4 in the above-mentioned example) is not always epitaxially deposited but may be formed of the semiconductor base 2 itself.

Moreover, while the first conductivity-type is n-type and the second conductivity-type is p-type, i.e. the photodiode of the light-receiving element is the anode common type arrangement in which the cathode is disposed on the light-receiving surface side as described above, the present invention is not limited to the above-mentioned example such as when conductivity-type of each portion may be reversed or the like. Therefore, the semiconductor device having the light-receiving element, its manufacturing method and the optical pickup device according to the present invention are not limited to the above-mentioned examples.

According to the above-mentioned present invention, upon its operation, the photodiode PD, i.e. light-receiving element is separated into a plurality of portions by the depletion layer. However, since it is possible to avoid the existence of the potential barrier against the carriers generated by light irradiated on and near the separating potion, carriers generated in any portion of the semiconductor may be diffused substantially uniformly. Therefore, even when the semiconductor device has the separated arrangement, it is possible to configure the semiconductor device having the light-receiving element with excellent frequency characteristics.

Therefore, in the optical pickup device, when a light is irradiated on the region including the separated regions of the photodiode divided into a plurality of portions to thereby output an RF signal which is required to become high-speed or when a light is irradiated on the extremely-narrow stripe pattern used in the laser-coupler, it is possible to realize satisfactory frequency characteristics.

Then, when a semiconductor device according to the present invention and an optical pickup device using such semiconductor device are manufactured, the number of process is not increased as compared with the prior art.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A semiconductor device, comprising:

a light-receiving element formed on a semiconductor substrate by a first junction portion comprised of a first conductivity-type first semiconductor portion and a second conductivity-type second semiconductor portion, a second junction portion comprised of a second conductivity-type separating region being formed on a part of said first semiconductor portion, said first semiconductor portion being separated into a plurality of portions by a spread of a depletion layer from said first junction portion and from said second junction portion with an application of a reverse bias voltage lower than a reverse bias voltage applied to said first junction portion when said light receiving element is operated, a first conductivity-type third semiconductor portion having a high impurity concentration as compared with that of said first semiconductor portion being formed on said semiconductor substrate at its surface at portions separated by said depletion layer formed on said first conductivity-type first semiconductor portion.

2. A semiconductor device having a light-receiving element as claimed in claim 1, characterized in that said first semiconductor portion is not separated into a plurality of portions by said depletion layer under a condition that a reverse bias voltage is not applied to said first junction portion.

3. A semiconductor device having a light-receiving element as claimed in claim 1, characterized in that said separating region is formed on said first semiconductor portion at its position distant from said second semiconductor portion with a predetermined interval.

4. A semiconductor device having a light-receiving element as claimed in claim 1, characterized in that said separating region is formed on said first semiconductor portion with a displacement toward the side of said second semiconductor portion.

5. A semiconductor device having a light-receiving element as claimed in claim 1, characterized in that said separating region is formed on said first semiconductor portion at an intermediate portion of a thickness direction of said first semiconductor portion.

6. A semiconductor device having a light-receiving element according to claim 1, characterized by further comprising a fourth semiconductor portion having a high impurity concentration as compared with that of said second semiconductor portion formed on said semiconductor substrate at its side opposite to the junction portion comprising said light-receiving element of said second conductivity-type second semiconductor portion in such a manner as to become adjacent to said second semiconductor portion.

7. A semiconductor device having a light-receiving element as claimed in claim 4, characterized in that a length from a surface of said semiconductor substrate to a fourth semiconductor portion formed beneath said second semiconductor portion is selected to be larger than an absorption length of an incident light on said light-receiving element.

8. A semiconductor device having a light-receiving element as claimed in claim 3, characterized in that a third semiconductor portion formed on or within said first semiconductor portion has a thickness selected in a range of from 0.01 $\mu$m to 0.2 $\mu$m.

9. A semiconductor device having a light-receiving element as claimed in claim 1, characterized in that said second semiconductor portion comprising said light-receiving element has an impurity concentration ranging from $1\times10^{11}$ to $1\times10^{16}$ atoms/cm$^3$.

10. A semiconductor device having a light-receiving element as claimed in claim 1, characterized in that said first and second semiconductor portions comprising said light-receiving element have impurity concentrations ranging from $1\times10^{11}$ to $1\times10^{16}$ atoms/cm$^3$.

* * * * *